US009275870B2

(12) United States Patent
Xu et al.

(10) Patent No.: US 9,275,870 B2
(45) Date of Patent: Mar. 1, 2016

(54) PLASMA PROCESSING METHOD AND PLASMA PROCESSING DEVICE

(71) Applicant: Advanced Micro-Fabrication Equipment Inc, Shanghai, Shanghai (CN)

(72) Inventors: Lei Xu, Shanghai (CN); Tuqiang Ni, Shanghai (CN); Zhaohui Xi, Shanghai (CN)

(73) Assignee: Advanced Micro-Fabrication Equipment Inc, Shanghai, Shanghai (CN)

( * ) Notice: Subject to any disclaimer, the term of this patent is extended or adjusted under 35 U.S.C. 154(b) by 291 days.

(21) Appl. No.: 14/052,650

(22) Filed: Oct. 11, 2013

(65) Prior Publication Data
US 2014/0106572 A1 Apr. 17, 2014

(30) Foreign Application Priority Data

Oct. 16, 2012 (CN) .......................... 2012 1 0393470

(51) Int. Cl.
*B23K 10/00* (2006.01)
*H01L 21/3065* (2006.01)
*H01J 37/32* (2006.01)

(52) U.S. Cl.
CPC ....... *H01L 21/3065* (2013.01); *H01J 37/32091* (2013.01); *H01J 37/32165* (2013.01); *H01J 37/32183* (2013.01)

(58) Field of Classification Search
CPC ............ H01L 21/3065; H01J 37/32091; H01J 37/32165; H01J 37/32183; H05H 1/46; H05H 1/36; H05G 1/26
USPC ............... 219/121.35, 121.4, 121.41, 121.43, 219/121.52
See application file for complete search history.

(56) References Cited

U.S. PATENT DOCUMENTS 7,320,734 B2 * 1/2008 Collins ................. H01J 37/321
118/726
2004/0244688 A1 12/2004 Himori et al.
(Continued)

FOREIGN PATENT DOCUMENTS

CN 101552187 A 10/2009
CN 101989525 A 3/2011
(Continued)

OTHER PUBLICATIONS

Office Action in Korean Patent Application No. 10-2013-0121761 dated Aug. 21 2014.
(Continued)

*Primary Examiner* — Mark Paschall
(74) *Attorney, Agent, or Firm* — Nixon Peabody LLP; Joseph Bach, Esq.

(57) ABSTRACT

A plasma processing method for a plasma processing device is provided. The plasma processing device includes a reaction chamber, multiple Radio Frequency (RF) power supplies with different RF frequency outputs apply RF electric fields to the reaction chamber, the output of at least one pulse RF power supply has multiple output states, and the processing method includes a match frequency obtaining step and a pulse processing step. In the match frequency obtaining step, the output state of the pulse RF power supply is switched to make the reaction chamber have multiple impedances to simulate the impedances in the pulse processing step. The output frequencies of the variable frequency RF power supply are adjusted to match the simulated impedances. The adjusted output frequencies are stored as match frequencies. In the subsequent pulse processing step, the fast switched impedances are instantly matched by the stored match frequencies.

20 Claims, 3 Drawing Sheets

(56) References Cited

U.S. PATENT DOCUMENTS

| | | |
|---|---|---|
| 2006/0220573 A1 | 10/2006 | Kotani et al. |
| 2008/0128087 A1 | 6/2008 | Hayano et al. |
| 2009/0255800 A1 | 10/2009 | Koshimizu |
| 2009/0284156 A1 | 11/2009 | Banna et al. |
| 2009/0298287 A1* | 12/2009 | Shannon ............ H01J 37/32091 438/680 |
| 2010/0130018 A1 | 5/2010 | Tokashiki et al. |
| 2011/0030900 A1 | 2/2011 | Chen et al. |
| 2011/0032047 A1 | 2/2011 | Yuzurihara et al. |
| 2013/0213573 A1 | 8/2013 | Valcore, Jr. et al. |
| 2013/0213934 A1* | 8/2013 | Valcore, Jr. ....... H01J 37/32091 216/67 |
| 2013/0214682 A1* | 8/2013 | Valcore, Jr. ....... H01J 37/32155 315/111.21 |
| 2014/0076713 A1* | 3/2014 | Valcore, Jr. ....... H01J 37/32165 204/164 |

FOREIGN PATENT DOCUMENTS

| | | |
|---|---|---|
| CN | 102474971 A | 5/2012 |
| JP | 2003-109946 A | 4/2003 |
| JP | 2006-310245 A | 11/2006 |
| JP | 2008-130398 A | 6/2008 |
| JP | 2009-246091 A | 10/2009 |
| JP | 2010-118222 A | 5/2010 |
| JP | 2011-525682 A | 9/2011 |
| JP | 2013-191554 A | 9/2013 |
| KR | 10-2010-0058346 A | 6/2010 |
| WO | 2012/094416 A1 | 7/2012 |

OTHER PUBLICATIONS

Decision of Allowance for Korean Patent Application No. 10-2013-0121761, mailed on Nov. 26, 2014.

Office Action in Chinese Patent Application No. 201210393470.X dated Sep. 6, 2015.

* cited by examiner

PLASMA PROCESSING METHOD AND PLASMA PROCESSING DEVICE

This application claims the priority of Chinese Patent Application No. 201210393470.X, entitled "PLASMA PROCESSING METHOD AND PLASMA PROCESSING DEVICE", filed with the Chinese State Intellectual Property Office on Oct. 16, 2012, the content of which is incorporated herein by reference in its entirety.

FIELD OF THE INVENTION

The invention relates to a plasma processing method and a plasma processing device, and in particular to a Radio Frequency (RF) power supply which provides RF power to the plasma processing device and a method for controlling the RF power supply.

BACKGROUND OF THE INVENTION

In the existing semiconductor processing, plasma processing apparatuses are widely used to process semiconductor wafers, so as to obtain micro dimension semiconductor devices and conductive connections. The plasma apparatus usually includes Capacitively Coupled Plasma (CCP) reaction chamber or Inductively Coupled Plasma (ICP) reaction chamber. These apparatuses usually have two RF power supplies, one is used to ionize the reaction gas inputted into the reaction chamber to generate plasma, and the other one is used to control the ion energy incident to the surface of the wafer.

The plasma processing device as shown in FIG. 1 includes a reaction chamber 100. A base 22 is contained by the reaction chamber, and a lower electrode is included in the base 22. A fixing device for fixing the substrate to be processed, such as an electrostatic chuck 21, is provided above the lower electrode, and a wafer 20 is fixed on the upper surface of the electrostatic chuck 21. An edge ring 10 surrounding the electrostatic chuck and the wafer is also provided. In the reaction chamber 100, a gas showerhead 11 is provided right above the base, and the gas showerhead is connected to a gas source 110, for supplying gas to the reaction chamber uniformly. Capacitive coupling is formed by the gas showerhead functioning as an upper electrode and the lower electrode in the base. A first RF power supply 31 is electrically connected to the lower electrode via a match 1, a second RF power supply 32 is electrically connected to the lower electrode via a match 2, and both of the first RF power supply and the second RF power supply have a fixed RF frequency. Since the impedance of the plasma will change when parameters such as gas pressure of the plasma, RF power and plasma concentration change, the parameter of the input power and the impedance need to be adjusted continuously to minimize the reflected power. In the plasma processing, both the first RF power supply 31 and the second RF power supply 32 supply powers to the lower electrode, and the match 1 and the match 2 can adjust the impedance via interior adjustable components respectively to minimize the RF reflected power. The frequency of the RF power source 31 or 32 may also be adjusted to much quickly adjust the input impedance. However, both the adjusting of the impedances of the matches 1, 2 and the adjusting of the frequencies of the RF power sources 31, 32 described above are achieved by moving an mechanical component (such as a variable capacitor or a variable inductor driven by a machine). In addition, in the procedure for minimizing the reflected power, the mechanical component described above moves in any direction, then the mechanical component is controlled to move to an appropriate position according to the feedback value of the reflected power, and therefore the procedure for sweeping the impedance of the match or the frequency of the RF power supply takes a long time, which reaches a second level, such as a time greater than 1 second.

Presently, a pulse plasma processing technology is required in many plasma processing. In some time periods of the processing, the RF power supply does not continuously supply powers, the output power will alternatively change between an on state and an off state or a high power state and a low power state; the waveform of the output power is in a pulse form, so it is referred to pulse plasma processing. The alternate frequencies are generally about 10K-100 KHZ, and the duty cycle of the on-off state may be adjusted in a range of 10%-90% according to requirements. In this way, each switching between the on state and the off state or between the high power state and the lower power state will cause fast change of the impedance in the reaction chamber, and the time of each change is in a millisecond level or even in a microsecond level. In the traditional art, auto frequency tuning (AFT) in the match circuit or the RF power supply is employed, and since the response time is much longer than millisecond level, the requirement of the pulse plasma processing can not be met.

Therefore, in view of the above reasons, there is a need for a fast impedance matching method in the pulse plasma processing by using only the existing hardware or by simply adjusting the existing hardware conditions.

SUMMARY OF THE INVENTION

In view of the disadvantages in the prior art, an object of the invention is to provide a plasma processing method for a plasma processing device applicable to the pulse plasma processing.

A plasma processing method for a plasma processing device is provided according to the invention. The plasma processing device includes a reaction chamber, where a base is contained in the reaction chamber and a substrate to be processed is fixed on the base, and the plasma processing device further includes multiple Radio Frequency (RF) power supplies with different RF frequency outputs to apply RF electric fields to the reaction chamber, an output power of at least one pulse RF power supply among the multiple RF power supplies has multiple power output states, and the processing method includes:

a match frequency obtaining step and a pulse processing step, where the match frequency obtaining step includes: simultaneously outputting RF electric fields to the reaction chamber by the multiple RF power supplies respectively, adjusting the output of the pulse RF power supply to be in a first power output state to make a first impedance be formed in the reaction chamber, and adjusting a frequency tuning element in at least one variable frequency RF power supply to obtain a first match frequency matching with the first impedance; adjusting the output of the pulse RF power supply to be in a second power output to make a second impedance be formed in the reaction chamber, and adjusting a frequency tuning element in at least one variable frequency RF power supply to obtain a second match frequency matching with the second impedance;

the pulse processing step includes: outputting RF electric fields to the reaction chamber by the multiple RF power supplies, setting the output of the pulse RF power supply to be in a first power output state, and meanwhile setting the output of the variable frequency power supply at first match frequency; setting the output of the pulse RF power supply to be in a second power output state, and meanwhile setting the output of the variable frequency power supply at second match frequency.

In the pulse processing step, the switching time of the states of the output power of the pulse RF power supply is less than 0.5 second. The time for adjusting the frequency tuning element in at least one variable frequency RF power supply to obtain a first match frequency or a second match frequency is generally greater than 0.5 second, and even greater than 1 second, where the frequency tuning element in the variable frequency RF power supply may be a variable inductor or a variable capacitor driven mechanically.

The output power in the first power output state that is applied by the pulse RF power supply is less than ½ of the output power in the second power output state, or even the output power of the pulse RF power supply in the first power output state is zero.

The number of the pulse RF power supplies may be greater than two. The output of the first pulse RF power supply and the output of the second pulse RF power supply are superposed to generate a third power output state causing the reaction chamber to have a third impedance; and the frequency tuning element in the variable frequency power supply is adjusted to obtain a third match frequency. If the output power of the first pulse RF power supply or the second pulse RF power supply in the low power output is greater than zero, the first pulse RF power supply or the second pulse RF power supply may also be the variable frequency RF power supply.

In the pulse plasma processing device controlled by the method of the invention, the matching of the fast alternating impedance can be achieved without making great changes to the hardware. Before the pulse processing stage, the variable frequency RF power supply is tuned within several seconds, so as to obtain the match frequency matching with the impedance which will appear in the pulse processing stage. Then in the pulse processing stage, the impedance of the plasma reaction chamber which changes in an alternating way is matched by directly using the match frequency.

The alternately changed power output states of the pulse RF power supply may also be the alternately changed output frequency, such that the output frequency switches between the first output frequency and the second output frequency, and the switching time is less than 0.5 second. The first output frequency is 1.5 times of the second output frequency. When the output state of the pulse RF power supply is switched, a variable frequency RF power supply other than the pulse RF power supply performs frequency tuning while keeping output power constant, but the reflected power and the output frequency are changed synchronously with the change of the output state of the pulse RF power supply.

BRIEF DESCRIPTION OF THE DRAWINGS

By reading the detailed description of the nonrestrictive embodiments hereinafter in conjunction with the accompanying drawings, other features, objects and advantages of the invention will become more obvious.

DETAILED DESCRIPTION OF THE INVENTION

The embodiments of the invention will be illustrated in detail below in conjunction with the accompanying drawings.

Figure 1:
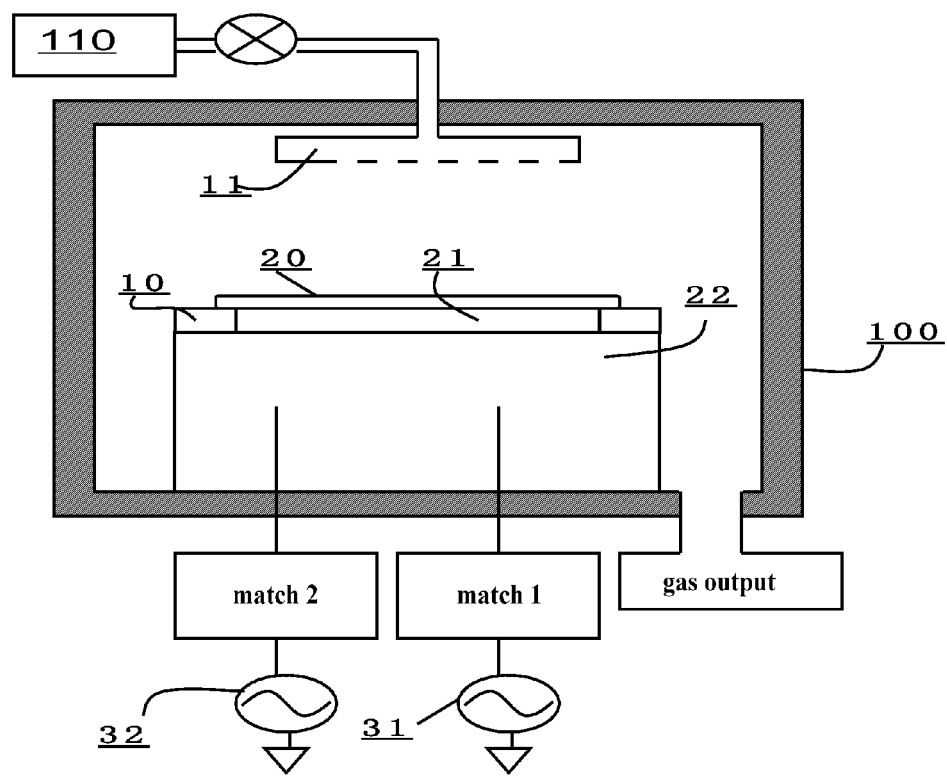
FIG. 1 is a structural schematic diagram of a plasma processing device in the prior art.
Figure 2:
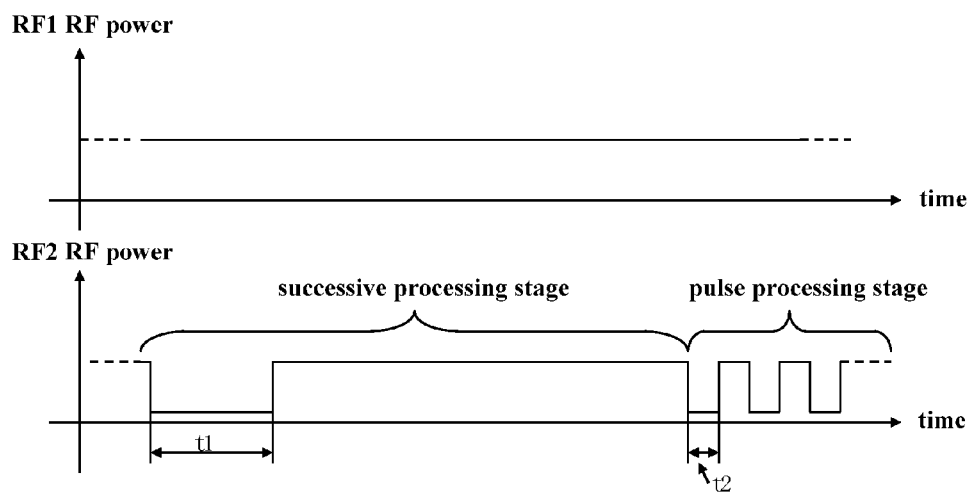
FIG. 2 is a schematic diagram of output powers of a first RF power supply and a second RF power supply according to a first embodiment of the invention.

FIG. 2 illustrates the first embodiment of the invention. The Radio Frequency (RF) powers of the first RF power supply RF1 and the second RF power supply RF2 in FIG. 2 respectively represent the output powers of the first RF power supply 31 and the second RF power supply 32 in FIG. 1. In the plasma processing, the plasma is firstly ignited, then after some possible transitional steps, the main plasma processing step, i.e., the successive processing stage, is carried out. Since steps such as the plasma igniting step are traditional steps in the prior art and have no direct influence on present invention, they are shown only by a dotted line in FIG. 2. Therefore, in the successive processing stage, both the first RF power supply RF1 and the second RF power supply RF2 are in a high power state, until an optical detector in the reaction chamber detects that the plasma processing reaches a certain level, for example in the plasma etching it is found that more than 70% of a particular material layer has been etched and it needs to enter a low speed etching stage. At this time, the pulse processing stage needs to be entered for the requirement of the plasma processing. The RF power outputted from RF2 switches between the high power output and the lower power output at a certain pulse frequency (such as 10K-100K), in some applications the low power output also could be zero, that is, RF2 is switched between the high power output and the off power output. Both of the above two types of pulse RF power output will cause the change of the state of the plasmas in the reaction chamber 100, and further cause the change of the impedance. As long as the low power output is lower than the high power output to some extent, for example the low power output is lower than ½ of the output power in the high power output step, the plasma in the reaction chamber will be changed significantly, and the impedance matching needs to be adjusted quickly. The invention is characterized in that: RF2 has a low power time period in the traditional successive processing stage, where the output power of RF2 in the low power time period is the same as the low output power in the subsequent pulse processing stage, and the time length t1 of the low power time period is long enough, for example t1 is greater than 1 second. In this way, by employing the traditional auto frequency tuning (AFT), the output frequency of the RF power supply RF1 can be adjusted to achieve the impedance matching, and a match frequency corresponding to the low power step, i.e., RF1-MFL (RF1 match frequency at low power level), is obtained and stored in a storage unit in the first RF source 31 or other controller that can control the output of the RF source 31. Similarly, in the successive processing stage, a period is set in which both RF1 and RF2 output power are at high power level, and in this period by employing the auto frequency tuning in the first RF power supply 31, a match frequency adapted to the high power step in the subsequent pulse matching stage, i.e., RF1-MFH (RF1 match frequency at high power level), may be obtained. In the successive processing stage, after the match frequency of low power step RF1-MFL and the match frequency of high power step RF1-MFH are obtained, the output match frequency of RF1 (RF1-MFL, RF1-MFH) may be directly stored, and the match frequency RF1-MFH/MFL could be applied in the corresponding high/low power step in the subsequence pulse processing stage, without adjusting again by using the preceding AFT; In this way, good matching can be achieved for the high frequency switch in the pulse processing stage. In the pulse processing, there are multiple periodic pulses, each pulse includes a low RF power step with a time period of t2 as shown in FIG. 2 and a high RF power step. The duty cycle which represents the ratio of time period of the high power step and the time period of the single pulse period may be adjusted as requirement.

RF2 shown in FIG. 2 may be a low frequency RF power for adjusting the incident plasma energy, for example RF2 is 2 Mhz; and RF2 is a source RF power for controlling the plasma concentration and may have a frequency about 60 Mhz. As illustrated by the first embodiment described above, by two times of AFT procedure in the first RF power supply in the successive processing stage, a first match frequency of 57.8 Mhz is obtained during the high power step when both of RF1 and RF2 supply powers is high, and a second match frequency of 58.2 Mhz is obtained during the low power step when only RF1 supplies high power. In the subsequent pulse processing stage, the automatic adjusting function in the RF power supply is disabled, such that the output frequency of the RF power supply 31 switches between 57.8 Mhz and 58.2 Mhz, corresponding to the pulse type switching of the output power of RF power supply 32, the output power switches between the high power output and the low power output.

In the invention, besides performing the pulse type switching on the output power of the low frequency RF power supply RF2 as illustrated in the first embodiment, the pulse type switching may also be performed on the output power of the high frequency RF power supply RF1. In this application, two match frequencies such as 1.92 Mhz and 1.95 Mhz which correspond to the RF power supply of 2 Mhz and the pulse type switching power supply of 60 Mhz are obtained. The specific parameters are dependent on the hardware parameters of the reaction chamber and the parameters of the input gas and the RF energy.

Figure 3:
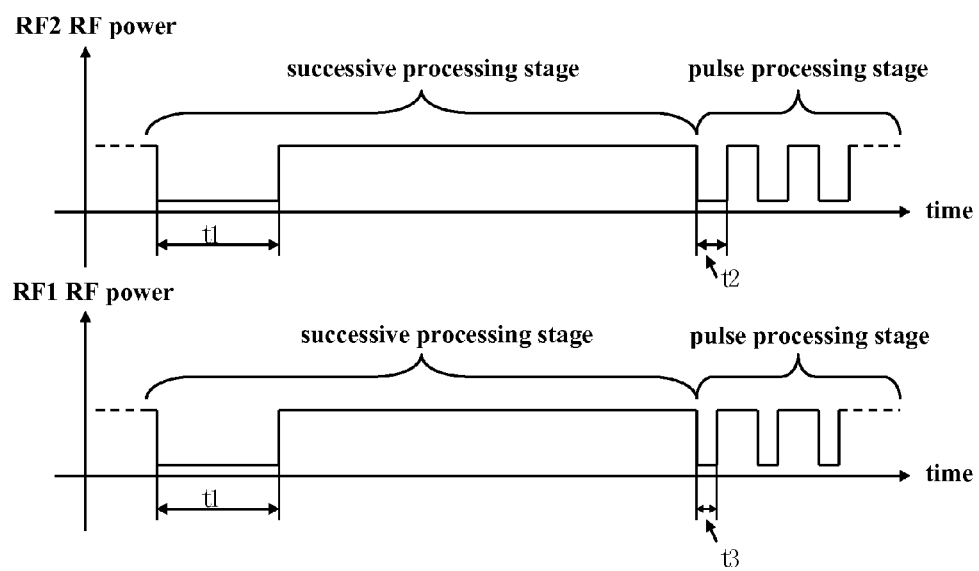
FIG. 3 is a schematic diagram of output powers of a first RF power supply and a second RF power supply according to a second embodiment of the invention.

FIG. 3 illustrates the second embodiment of the invention, where both RF1 and RF2 perform pulse type switching between the high power and the low power output in the pulse processing stage. The time period t2 of the low power step of RF2 is greater than the time period t3 of the low power step of RF1, therefore compared with the state of the first embodiment, there is also a plasma state, i.e., a state in which both RF1 and RF2 are at the low power. In order to match the impedance in the plasma state in the pulse processing stage, an impedance match frequency tuning step is performed in the successive processing stage; in this step both the powers of RF1 and RF2 are set to be low powers (such as power less than 400 w), and a match frequency corresponding to the plasma state, such as 58.0 Mhz, is obtained by AFT. The obtained match frequency is also stored in the storage unit until the pulse processing stage is entered, the output frequency of the first RF power source is set as 58.0 Mhz when both RF1 and RF2 output the low power, then the output frequency of the first RF power source is switched to 58.2 Mhz and 57.8 Mhz sequentially, until the whole pulse processing stage is completed.

In the invention, when the low power output of the pulse RF power supply is greater than zero, a variable frequency RF power supply other than said pulse RF power supply may be employed to adjusted the output frequency and obtain the match frequency, or the pulse RF power supply itself may be employed to adjusted the output frequency and obtain the match frequency. When the low power output of the pulse RF power supply is zero, i.e., the output of the pulse RF power supply is turned off, the match frequency can only be obtained by adjusting the output frequency of other variable frequency RF power supply. Therefore, in the second embodiment shown in FIG. 3, if the output powers of RF1 and RF2 are small but greater than zero in the time period of t1, the match frequency can be obtained by adjusting the RF frequency output of RF1, or the optimal match frequency may be obtained by adjusting the output frequencies of both RF1 and RF2.

In the invention, besides using two RF power supplies to control the plasma processing, a third RF power supply RF3 or more RF power supplies may be applied to further regulate the plasma processing. The extra RF power supply may be a successive one or may be a pulsed one, and these RF power supply may influence the optimal match frequency in the RF matching, therefore a corresponding time period needs to be set in the preceding successive processing stage so as to obtain the corresponding match frequency.

Any other parameters which will cause the change of the match impedance in the pulse processing stage can be simulated in the successive processing stage in advance by applying identical parameters in a small time period t1, so as to acquire the same impedance as that in the pulse switching stage. Then the match RF frequency matching with the simulated impedance is obtained by utilizing the AFT function, and the AFT function is disabled when entering the pulse processing stage. At last, the present invention uses the obtained match RF frequencies instantly in corresponding pulse steps to quickly achieve impedance matching.

In the invention, when one plasma processing procedure including the successive processing stage and the pulse processing stage is completed, the match RF frequency such as 57.8 Mhz, 58.2 Mhz and 58.0 Mhz obtained in the preceding steps may also be used in the subsequent same plasma processing procedures since all of the processing parameters such as the RF frequency, the energy, the structure of the reaction chamber, and the type of the gas will not be changed obviously in the subsequent same plasma processing procedures. In this way, the whole processing efficiency can be further improved. In order to acquire a more accurate match frequency, the impedance in the pulse plasma processing stage may be simulated again after multiple similar plasma processing, and the AFT is enabled again to obtain an accurate match frequency.

The RF power supply 31 and the RF power supply 32 of the invention have similar structures. The RF power supply 31 includes a frequency generator to generate a variable frequency. A variable capacitance is included in the frequency generator. The value of the output frequency may be changed by changing the parameter of the variable capacitance, and the AFT may also be achieved by adjusting the parameter of the capacitance to obtain an optimal match frequency. A RF signal outputted by the generator is amplified by a power amplifier and thus a required power is outputted to the match 1 at downstream and finally reaches the lower electrode in the plasma reaction chamber. The RF power supply 31 further includes a storage unit, which may be used to store multiple match frequencies obtained by AFT. A controller controls the amplification factor of the power amplifier, so as to obtain the output power of the RF power supply. In the pulse processing stage, the power amplification factor is periodically controlled to switch between two values alternately. The controller also obtains the match frequency by adjusting the variable capacitance.

In the invention, the RF power supply with the pulse change of the RF power supplies 31, 32 may switch between the high power output and the low power output described above. In another embodiment, RF power supply 31, 32 may also switch between the high frequency output and the low frequency output. For example, the RF power supply 31 is the pulse RF power supply, the output frequency of which switches between a first frequency and a second frequency, and the output power of the second RF power supply 32 keeps constant. In the match frequency obtaining step, the output frequency of the second RF power supply 32 is adjusted to obtain match frequencies corresponding to at least two impedance states. Then in the subsequent pulse processing stage, fast matching is achieved by directly utilizing the obtained match frequencies. The second RF power supply 32 whose output power keeps constant may also be a power supply having the same structure as that of the pulse RF power supply 31. The RF power supply 31 or 32 has at least two output states, and each of the output states includes at least 3 sets of adjustable parameters: a forward output power Pf, a reflected power Pr, and a frequency Freq. When the pulse RF power supply 31 switches between two output states, the output power of the RF power supply 32 keeps constant, the reflected power Pr is changed, and the output frequency Freq is changed by adjustment of the AFT function.

The specific embodiments of the invention are described above. It should be understood that, the invention is not limited to the specific embodiments described above, those skilled in the art can make various modifications or variations within the scope of the claims, which will not affect the essence content of the invention.

The invention claimed is:

1. A plasma processing method for a plasma processing device, the plasma processing device comprising a reaction chamber, wherein a base is contained in the reaction chamber and a substrate to be processed is fixed on the base, the plasma processing device further comprising a first Radio Frequency (RF) power supply with a first RF frequency output and a second RF power supply with a second RF frequency output to apply a RF electric field to the reaction chamber, the processing method comprising a match frequency obtaining step and a pulse processing step, wherein the match frequency obtaining step comprises:
applying a high power RF electric field to the reaction chamber by the first RF power supply and meanwhile applying a high power RF electric field by the second RF power supply;
and tuning an output frequency of the first RF power supply to obtain a first match frequency, so as to minimize the reflected power of the first RF power supply;
applying a high power RF electric field to the reaction chamber by the first RF power supply and meanwhile applying a low power RF electric field by the second RF power supply;
and tuning the output frequency of the first RF power supply to obtain a second match frequency, so as to minimize the reflected power of the first RF power supply;
in the pulse processing step, a high power RF electric field is applied to the reaction chamber by the first RF power supply, the power of the RF electric field applied to the reaction chamber by the second RF power supply switches between high power level and low power level, and the output frequency of the first RF power supply switches between the first match frequency and the second match frequency synchronously.

2. The method according to claim 1, wherein the first RF power supply outputs a high frequency RF electric field to the reaction chamber to generate plasmas, and the second RF power supply outputs a low frequency RF electric field to the base in the reaction chamber; the high frequency RF is greater than 10 Mhz, and the low frequency RF is less than 10 Mhz.

3. The method according to claim 1, wherein in the match frequency obtaining step, the time for tuning the output frequency of the first RF power supply to obtain the first match frequency or the second match frequency is greater than 1 second, and in the pulse processing step, the switching time is less than 0.5 second.

4. The method according to claim 1, wherein the plasma processing device further comprises: a first match circuit connected between the first RF power supply and the base, and a second match circuit connected between the second RF power supply and the base.

5. The method according to claim 1, wherein the plasma processing device further comprises a controller for tuning the output frequency of the first RF power supply to obtain the first match frequency and the second match frequency, and storing the obtained first match frequency and second match frequency in the controller, the controller judges the states of the output powers of the first RF power supply and the second RF power supply in the pulse processing step and selects the output frequencies of the first RF power supply at the first match frequency and the second match frequency.

6. The method according to claim 1, wherein the plasma processing method comprises a successive processing step and the pulse processing step, and the match frequency obtaining step is included in the successive processing step.

7. The method according to claim 1, wherein the match frequency obtaining step further comprises: applying a low power RF electric field to the reaction chamber by the first RF power supply and meanwhile applying a low power RF electric field by the second RF power supply;
and tuning the output frequency of the first RF power supply to obtain a third match frequency so as to minimize the reflected power of the first RF power supply.

8. The method according to claim 1, wherein the low power RF electric field applied by the second RF power supply has an intensity less than ½ of intensity of the high power RF electric field.

9. The method according to claim 8, wherein the low power RF electric field applied by the second RF power supply is zero.

10. A plasma processing method for a plasma processing device, the plasma processing device comprising a reaction chamber, wherein a base is contained in the reaction chamber and a substrate to be processed is fixed on the base, the plasma processing device further comprising a first Radio Frequency (RF) power supply with a first RF frequency output and a second RF power supply with a second RF frequency output to apply a RF electric field to the reaction chamber, wherein the second RF power supply has a high power output and a low power output, and the low power output is less than the high power output and greater than zero, the processing method comprising a match frequency obtaining step and a pulse processing step, wherein the match frequency obtaining step comprises:
applying RF electric fields to the reaction chamber by the first RF power supply and the second RF power supply, wherein the second RF power supply applies a RF electric field with a low power output to the reaction chamber; and tuning an output frequency of the second RF power supply to obtain a first match frequency so as to minimize the reflected power of the second RF power supply;
applying a RF electric field with a high power output to the reaction chamber by the second RF power supply; and tuning the output frequency of the second RF power supply to obtain a second match frequency so as to minimize the reflected power of the second RF power supply;
in the pulse processing step, the power of the RF electric field applied to the reaction chamber by the second RF power supply switches between low power output and high power output, and the output frequency of the second RF power supply switches between the first match frequency and the second match frequency synchronously with the switching of the output power of the second RF power supply.

11. A plasma processing method for a plasma processing device, the plasma processing device comprising a reaction chamber, wherein a base is contained in the reaction chamber and a substrate to be processed is fixed on the base, the plasma processing device further comprising a plurality of Radio Frequency (RF) power supplies with different RF frequency outputs to apply RF electric fields to the reaction chamber, at least one of the plurality of RF power supplies being a pulse RF power supply, and the pulse RF power supply having a plurality of power output states; the processing method comprising a match frequency obtaining step and a pulse processing step, wherein the match frequency obtaining step comprises:
simultaneously outputting RF electric fields to the reaction chamber by the plurality of RF power supplies respectively; adjusting the output of the pulse RF power supply to be in a first power output state to have a first impedance be formed in the reaction chamber; and adjusting a frequency tuning element in at least one variable frequency RF power supply to obtain a first match frequency matching the first impedance;
adjusting the output of the pulse RF power supply to be in a second power output state to have a second impedance be formed in the reaction chamber; and adjusting a frequency tuning element in at least one variable frequency RF power supply to obtain a second match frequency matching with the second impedance;

the pulse processing step comprises:
outputting RF electric fields to the reaction chamber by the plurality of RF power supplies; setting the output of the pulse RF power supply to be in the first power output state, and meanwhile setting the output of the variable frequency RF power supply to have the first match frequency;
setting the output of the pulse RF power supply to be in the second power output state, and meanwhile setting the output of the variable frequency RF power supply to have the second match frequency.

12. The method according to claim 11, wherein in the pulse processing step, the switching time of the states of the output power of the pulse RF power supply is less than 0.5 second.

13. The method according to claim 11, wherein the power output in the first power output state that is applied by the pulse RF power supply is less than ½ of the power output in the second power output state.

14. The method according to claim 13, wherein the pulse RF electric field in the first power output state is zero.

15. The method according to claim 13, wherein the pulse RF electric field in the first power output state is greater than zero, and the pulse RF power supply and the variable frequency RF power supply are the same RF power supply.

16. A plasma processing method for a plasma processing device, the plasma processing device comprising a reaction chamber, wherein a base is included in the reaction chamber and a substrate to be processed is fixed on the base, the plasma processing device further comprising a plurality of Radio Frequency (RF) power supplies with different RF frequency outputs to apply RF electric fields to the reaction chamber, at least one of the plurality of RF power supplies being a pulse RF power supply, and the pulse RF power supply having a plurality of power output states; the processing method comprising a match frequency obtaining step and a pulse processing step, wherein the match frequency obtaining step comprises:
simultaneously applying RF electric fields to the reaction chamber by the plurality of RF power supplies respectively; adjusting the output of the pulse RF power supply to be in a first output state to form a first impedance in the reaction chamber; and adjusting a frequency tuning element in at least one variable frequency RF power supply to obtain a first match frequency matching with the first impedance;
adjusting the output of the pulse RF power supply to be in a second output state to form a second impedance in the reaction chamber; and adjusting a frequency tuning element in at least one variable frequency RF power supply to obtain a second match frequency matching with the second impedance;

the pulse processing step comprises:
applying RF electric fields to the reaction chamber by the plurality of RF power supplies; setting the output of the pulse RF power supply to be in the first output state, and meanwhile setting the output of the variable frequency RF power supply at first match frequency; and
setting the output of the pulse RF power supply to be in the second output state, and meanwhile setting the output of the variable frequency RF power supply at second match frequency.

17. The method according to claim 16, wherein in the pulse processing step, the switching time of the output states of the pulse RF power supply is less than 0.5 second.

18. The method according to claim 17, wherein the pulse RF power supply in the first output state has a first RF frequency, and the pulse RF power supply in the second output state has a second RF frequency, and the first RF frequency is 1.5 times of the second RF frequency.

19. The method according to claim 16, wherein the variable frequency RF power supply has a first output state and a second output state, and the first output state and the second output state correspond to different reflected powers.

20. The method according to claim 19, wherein the variable frequency RF power supply has the same output power in the first output state and in the second output state.

* * * * *